(12) United States Patent
Marzaki

(10) Patent No.: US 10,535,672 B2
(45) Date of Patent: Jan. 14, 2020

(54) INTEGRATED CIRCUIT WITH DECOUPLING CAPACITOR IN A STRUCTURE OF THE TRIPLE WELL TYPE

(71) Applicant: STMicroelectronics (Rousset) SAS, Rousset (FR)

(72) Inventor: Abderrezak Marzaki, Marseilles (FR)

(73) Assignee: STMicroelectronics (Rousset) SAS, Rousset (FR)

(*) Notice: Subject to any disclaimer, the term of this patent is extended or adjusted under 35 U.S.C. 154(b) by 43 days.

(21) Appl. No.: 15/486,434

(22) Filed: Apr. 13, 2017

(65) Prior Publication Data

US 2018/0102377 A1 Apr. 12, 2018

(30) Foreign Application Priority Data

Oct. 11, 2016 (FR) ...................................... 16 59771

(51) Int. Cl.
*H01L 27/11524* (2017.01)
*H01L 29/06* (2006.01)
*H01L 27/06* (2006.01)

(52) U.S. Cl.
CPC .... *H01L 27/11524* (2013.01); *H01L 27/0629* (2013.01); *H01L 29/0649* (2013.01)

(58) Field of Classification Search
CPC ........... H01L 27/11524; H01L 27/0629; H01L 27/22631; H01L 29/66181; H01L 29/0649; H01L 29/945; H01L 21/823481
See application file for complete search history.

(56) References Cited

U.S. PATENT DOCUMENTS

| 7,449,744 | B1* | 11/2008 | Yu ......................... H01L 27/115 257/316 |
| 8,492,820 | B2* | 7/2013 | Anderson ......... H01L 21/76224 257/301 |
| 8,525,245 | B2* | 9/2013 | Erickson ................. H01L 21/84 257/301 |
| 8,816,470 | B2* | 8/2014 | Erickson ............. H01L 21/2652 257/510 |
| 9,349,793 | B2* | 5/2016 | Jaffe ................... H01L 29/0649 |
| 10,109,601 | B2* | 10/2018 | Marzaki ................ H01L 23/576 |
| 2007/0278612 | A1 | 12/2007 | Williams et al. |
| 2011/0018094 | A1 | 1/2011 | Chapman et al. |

FOREIGN PATENT DOCUMENTS

EP 1335425 A1 8/2003
FR 3021457 A1 11/2015

OTHER PUBLICATIONS

INPI Search Report and Written Opinion for FR 1659771 dated Jun. 7, 2017 (8 pages).

* cited by examiner

*Primary Examiner* — Seahvosh Nikmanesh
(74) *Attorney, Agent, or Firm* — Crowe & Dunlevy

(57) ABSTRACT

A well of a first conductivity type is insulated from a substrate of the same first conductivity type by a structure of a triple well type. The structure includes a trench having an electrically conductive central part enclosed in an insulating sheath. The trench supports a first electrode of a decoupling capacitor, with a second electrode provided by the well.

17 Claims, 4 Drawing Sheets

INTEGRATED CIRCUIT WITH DECOUPLING CAPACITOR IN A STRUCTURE OF THE TRIPLE WELL TYPE

PRIORITY CLAIM

This application claims the priority benefit of French Application for Patent No. 1659771, filed on Oct. 11, 2016, the disclosure of which is hereby incorporated by reference in its entirety.

TECHNICAL FIELD

Embodiments relate to integrated circuits, in particular those using structures of the triple well type, thus making it possible to insulate a well of a first conductivity type, for example of P type conductivity, from another semiconductor zone, for example the rest of the substrate, also of the first conductivity type, and in particular those having decoupling capacitors between the supply voltage and the ground, more commonly known by the person skilled in the art by the term "filler capacitor".

BACKGROUND

FIG. 1 schematically illustrates an integrated circuit IC having a structure of the triple well type, making it possible to insulate a well 1, here of P type conductivity, from the rest of the semiconductor substrate SB, which is also of P type conductivity.

More precisely, the well 1 is insulated from the substrate SB by an insulating region having a first insulating trench 2 (for example, of the type known by the person skilled in the art by the acronym STI: shallow trench isolation) extending into the substrate from a first face FS of the substrate and surrounding the well 1.

The insulating region also has a semiconductor layer 3 of N type conductivity buried in the substrate below the well 1.

Lastly, the insulating region comprises an intermediate insulating zone ensuring electrical insulation continuity between the first insulating trench 2 and the buried semiconductor layer 3.

Here, this intermediate insulating zone has a well 4 laterally surrounding the well 1 and extending between the first insulating trench 2 and the buried semiconductor layer 3. This well 4 is produced by implantation of dopants of N type conductivity.

Such an insulating region based on implanted wells 4 requires that a certain distance be maintained between the edge of the insulating trench 2 and the edge of the well 4 so as to prevent any risk of overflow of N dopants into the P well by a diffusion phenomenon, the effect of which would be to reduce the effective size of the P well.

However, this dimensional constraint presents a surface cost which leads to an increase in the surface area of the wells.

These wells may furthermore be used in order to form therein decoupling capacitors connected between the supply voltage and the ground. These decoupling capacitors contain, for example, one or more lines of polysilicon insulated from the P well by an insulating material such as a silicon oxide. However, it is found that such decoupling capacitors have non-negligible leakage currents and a capacitive value which may in certain cases be relatively low.

There is a need in the art to reduce the surface occupancy of a semiconductor well insulated by a structure of the triple well type, while further producing in this well decoupling capacitors having a higher capacitance value and reduced leakage currents.

SUMMARY

One aspect provides an integrated circuit comprising a semiconductor substrate of a first conductivity type, for example of P type conductivity, and at least one semiconductor well of the first conductivity type, for example of P type conductivity, which is insulated from the substrate by an insulating region having a first insulating trench extending into the substrate from a first face of the substrate and surrounding the at least one well, a semiconductor layer of a second conductivity type, opposite to the first conductivity type, for example of N type conductivity, buried in the substrate below the well, and an intermediate insulating zone configured in order to ensure electrical insulation continuity between the first insulating trench and the buried semiconductor layer.

The intermediate insulating zone comprises a second trench having at least one peripheral part surrounding the at least one well, the peripheral part having a first part extending from the first face of the substrate while being in contact with the first insulating trench, the first part being extended by a second part lying between the first insulating trench and the buried semiconductor layer.

The second trench has a central portion which is configured in order to be electrically conductive, for example of polysilicon, and is enclosed in an insulating sheath, for example of silicon dioxide, and the integrated circuit comprises at least one first contact configured in order to be electrically conductive on the central portion and at least one second contact configured in order to be electrically conductive on the at least one well.

Thus, by its peripheral part, the second trench contributes to the insulation of the semiconductor well from the rest of the substrate. Furthermore, its electrically conductive part enclosed in an insulating sheath makes it possible to form a decoupling capacitor with the semiconductor well.

The insulation of the semiconductor well by such a second trench makes it possible to overcome the problem of surface occupancy mentioned above in connection with implanted wells. Furthermore, use of this trench for decoupling capacitor purposes as well makes it possible to increase the capacitance value of such a decoupling capacitor while limiting the leakage current.

In order to further increase the capacitance value of the decoupling capacitor, provision may be made for the second trench to have at least one additional branch connected to the peripheral part and extending inside the at least one semiconductor well, or even a plurality of parallel additional branches connected to the peripheral part and extending inside the at least one semiconductor well.

Several alternative embodiments are possible.

Thus, the first part of the at least one peripheral part of the second trench may lie entirely in the first insulating trench. In other words, the second trench may pass through the first insulating trench (for example of the STI type).

As a variant, the first part of the at least one peripheral part of the second trench may lie entirely between the well and the first insulating trench. This first part of the peripheral part of the second trench is then advantageously adjacent to the first insulating trench.

The second part of the peripheral part of the second trench may come in contact with the buried semiconductor layer.

As a variant, the bottom of this second part may lie at a distance from the buried semiconductor layer, in which case the intermediate insulating zone has an implanted zone of the second conductivity type, for example of N type conductivity, lying between the bottom of the second part and the buried semiconductor layer.

Such an embodiment is advantageously compatible with production, within the integrated circuit, of a memory device having a memory plane having nonvolatile memory cells and select transistors with buried gates, because the second trench may have a depth substantially equal to that of the buried gates.

BRIEF DESCRIPTION OF THE DRAWINGS

Other advantages and characteristics of the invention will become apparent on studying the detailed description of entirely non-limiting embodiments and the appended drawings, in which.

DETAILED DESCRIPTION

Figure 1:
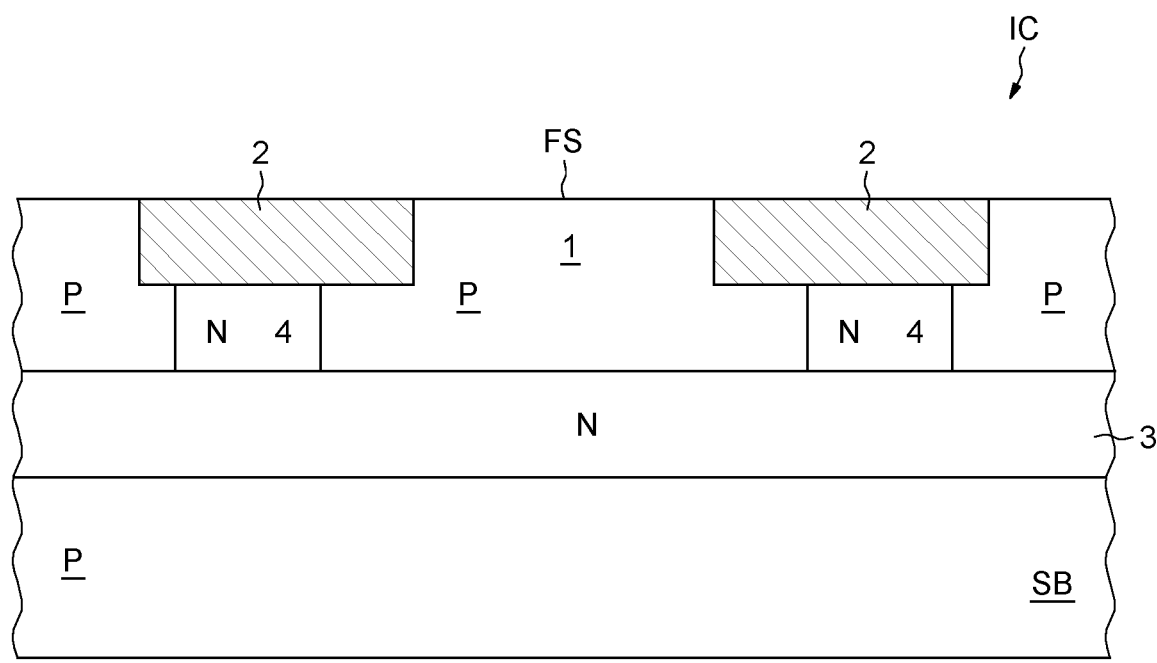
FIG. 1, already described, illustrates an example of electrical insulation of a semiconductor well, of the triple well type, according to the prior art.
Figure 2:
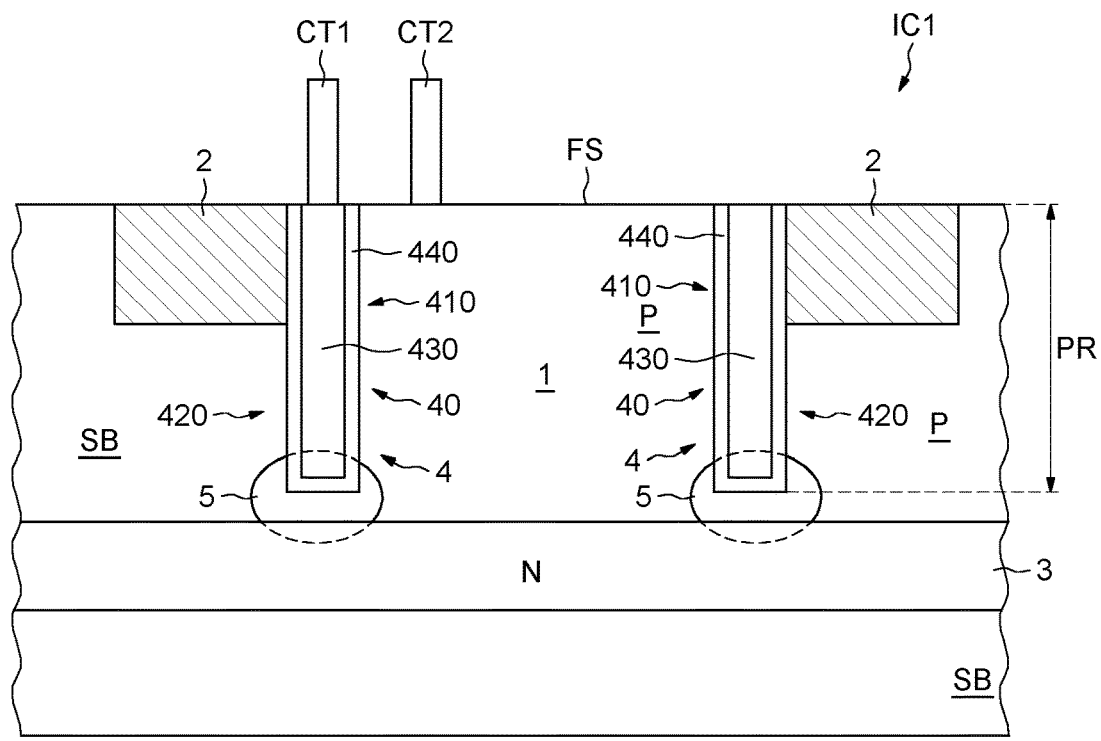
FIG. 2 is a cross-section of an integrated circuit including a capacitor.
Figure 3:
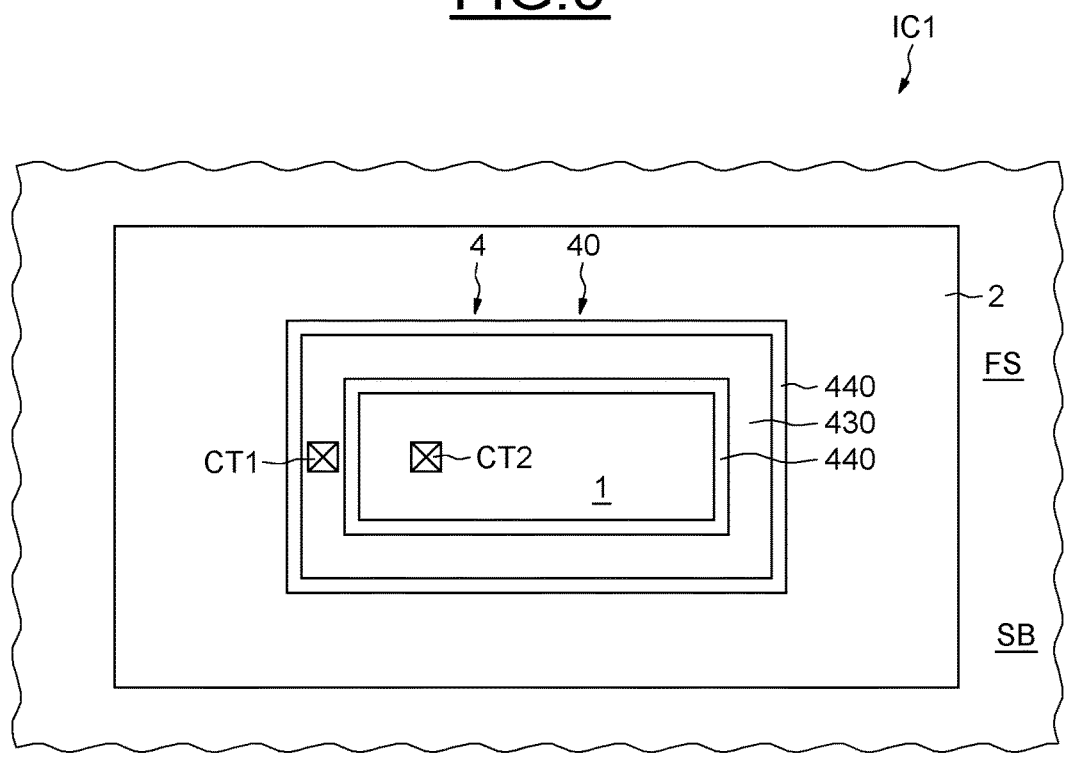
FIG. 3 is a top (or plan) view of the integrated circuit.

In FIG. 2 and in FIG. 3, which is a plan view of FIG. 2, the reference IC1 denotes an integrated circuit containing a semiconductor well 1 having a first conductivity type, here of P type conductivity.

As will now be seen, this well 1 is electrically insulated from the substrate SB, which is also of P type conductivity, by an insulating region having a certain number of elements.

More precisely, the insulating region has a first insulating trench 2, for example of the shallow trench type (STI: shallow trench isolation), surrounding the well 1 and extending into the substrate SB from a first face, or upper face, FS of the substrate.

The insulating region also has a semiconductor layer of a second conductivity type, here of N type conductivity, referenced 3, buried in the substrate SB below the well 1.

The insulating region also has an intermediate insulating zone ensuring electrical insulation continuity between the first insulating trench 2 and the buried semiconductor layer 3.

In this embodiment, the intermediate insulating zone comprises a second trench 4 having a peripheral part 40 surrounding the well 1.

This peripheral part has a first part 410 extending from the first face FS of the substrate while being in contact with the first insulating region 2.

This first part 410, which is adjacent to the first insulating trench 2, is extended by a second part 420 which lies between the first insulating trench 2 and the buried semiconductor layer 3.

In this embodiment, the bottom of the second part 420 of the peripheral part 40 lies at a distance from the buried semiconductor layer 3.

Consequently, so as to ensure electrical insulation continuity, the intermediate insulating zone also has an implanted zone 5, of N type conductivity, lying between the bottom of the second part 420 of the second trench 4 and the buried semiconductor layer 3.

The semiconductor well 1 is therefore fully electrically insulated from the rest of the substrate SB.

Furthermore, the second trench 4 has an electrically conductive central portion 430 enclosed in an insulating sheath 440. By way of non-limiting example, the electrically conductive central part 430 may contain polysilicon and the insulating sheath may contain silicon dioxide.

By way of non-limiting example, the area of the cross section of the central part of the trench 4 may be of the order of 0.1 $\mu m^2$, while the thickness of the insulating sheath 440 may be of the order of one hundred angstroms.

Further to its insulation function, the second trench 4 forms a decoupling capacitor with the well 1. A first electrode of this decoupling capacitor is formed by the central part 430 of the trench 4, while the second electrode of the decoupling capacitor is formed by the well 1. The dielectric of the decoupling capacitor is formed by the insulating sheath 440.

Also, provision is made for the integrated circuit IC also to have a first electrically conductive contact CT1 on the central portion 430 of the second trench 4 and a second electrically conductive contact CT2 on the well 1.

Then, for example, the supply voltage Vdd may be applied to the second contact CT2 and the ground may be applied to the first contact CT1, which makes it possible to have a decoupling capacitor between the supply voltage and ground.

The peripheral part of this second trench 4 makes it possible to have a corresponding capacitive value, typically a capacitive value half as great as that of a decoupling capacitor of the prior art.

Furthermore, this structure with trenches also makes it possible to limit the leakage currents of the decoupling capacitor.

As has just been seen, the bottom of the second trench 4 lies at a distance from the buried semiconductor layer 3.

Figure 4:
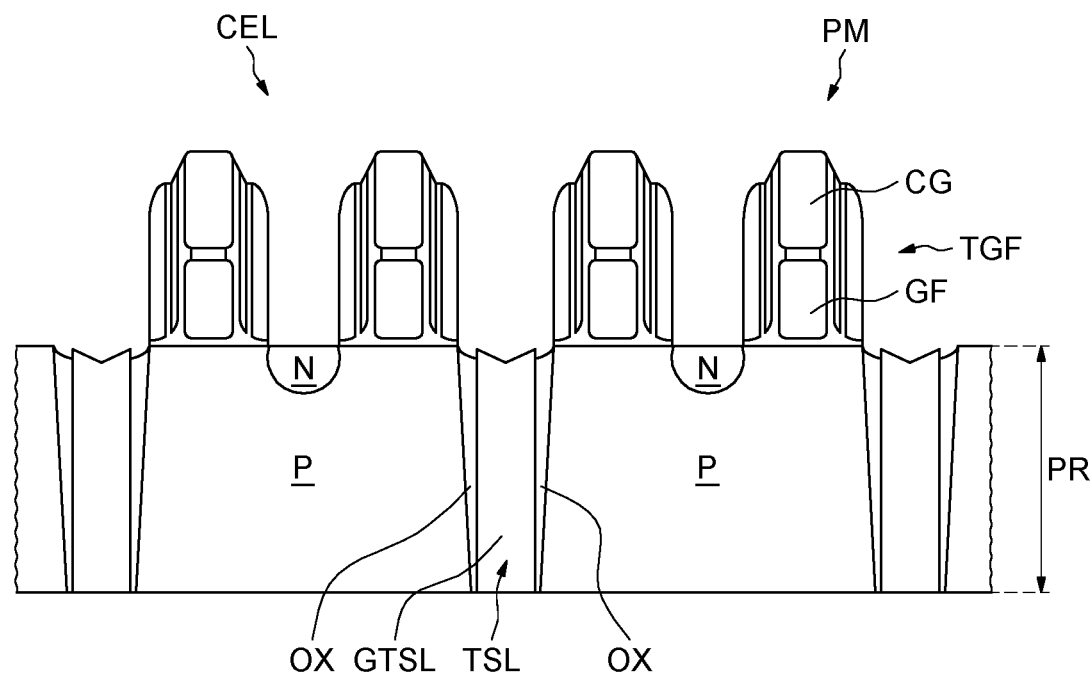
FIG. 4 is a cross-section of a memory device using buried gate transistors.

This is compatible with a method for producing a memory device whose memory plane PM has, as illustrated schematically in FIG. 4, nonvolatile memory cells CEL and select transistors TSL with buried gates.

More precisely, each memory cell CEL has a floating-gate transistor TGF produced in and on a P type semiconductor well separated from the underlying P type substrate by an N type semiconductor layer (not represented here for the sake of simplicity).

Conventionally, each floating-gate transistor has a floating gate GF, for example made of polysilicon, and a control gate CG.

Each select transistor TSL makes it possible to select a row of cells and is an MOS transistor whose gate GTSL is a gate buried in the P type well and electrically insulated from this well by a gate oxide OX, typically silicon dioxide.

The buried gate GTSL is common to the two adjacent select transistors TSL, whose two gate oxides OX respectively lie on the two side faces of this buried gate.

Furthermore, as illustrated in FIG. 4, the depth PR of the trenches which have made it possible to produce the buried select gates GTSL is then advantageously identical or substantially identical to the depth PR of the second trench 4 illustrated in FIG. 2.

Figure 5:
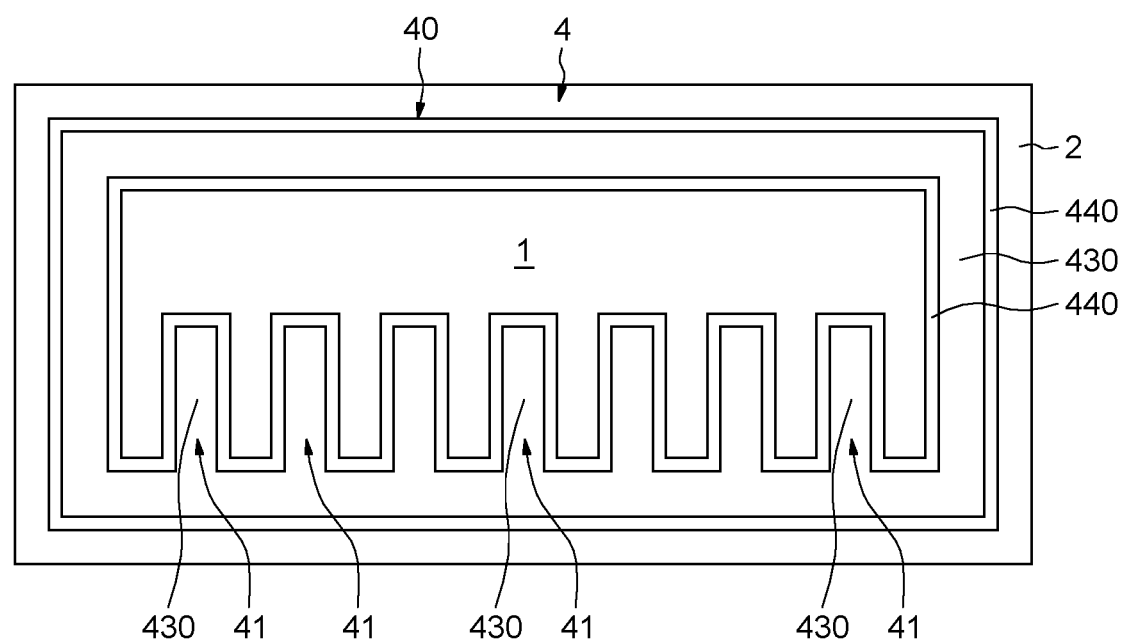
FIG. 5 is a top (or plan) view of the integrated circuit.

In order to increase the capacitive value of the decoupling capacitor even further, it is possible to provide, as illustrated in FIG. 5, an embodiment in which the second trench 4 has at least one additional branch, here a plurality of parallel additional branches 41, connected to the peripheral part 40 of the trench 4 and extending inside the semiconductor well 1.

Figure 6:
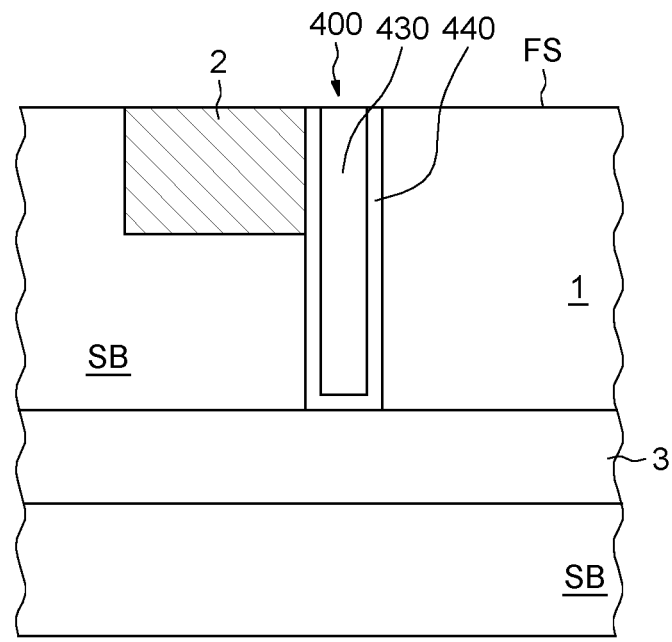
FIG. 6 is a cross-section of an integrated circuit including a capacitor.
Figure 7:
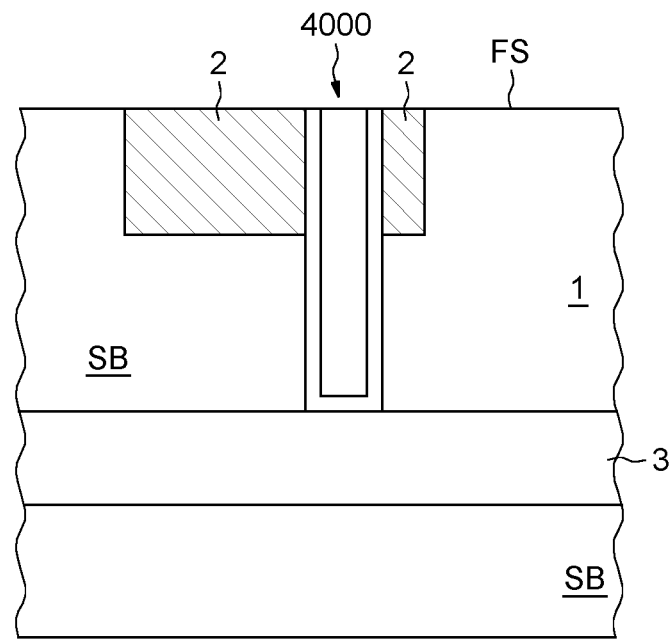
FIG. 7 is a cross-section of an integrated circuit including a capacitor.

Other alternative embodiments are possible, these being illustrated in FIGS. 6 and 7. Thus, as illustrated in FIG. 6, it is possible to provide a second trench 400 of which the bottom of the second part no longer lies at a distance from the buried semiconductor layer 3 but comes in contact therewith.

Similarly, as illustrated in FIG. 7, instead of providing a second trench 40 which is adjacent to the first insulating trench 2 once production has been completed, it is possible to provide a second trench 4000 passing through the first insulating trench 2. In other words, the first part of this second trench 4000 then lies entirely within the first insulating trench 2.

In the example illustrated in FIG. 7, the second trench 4000 comes in contact with the buried semiconductor layer 3. Of course, it would be entirely conceivable for the bottom of this second trench 4000 to lie at a distance from this buried semiconductor layer 3, as illustrated in FIG. 2, for which an implanted zone 5 of N type conductivity would then be necessary.

The invention claimed is:

1. An integrated circuit, comprising:
a semiconductor substrate of a first conductivity type;
at least one semiconductor well of the first conductivity type within said semiconductor substrate;
an insulating region configured to insulate the at least one semiconductor well from the substrate, said insulating region comprising:
   a first insulating trench extending into the substrate from a first face of the substrate and surrounding the at least one semiconductor well;
   a semiconductor layer of a second conductivity type, opposite to the first conductivity type, buried in the semiconductor substrate below the at least one semiconductor well; and
   an intermediate insulating zone configured to ensure electrical insulation continuity between the first insulating trench and the buried semiconductor layer, wherein the intermediate insulating zone comprises:
   a second trench having at least one peripheral part surrounding the at least one semiconductor well, the peripheral part having a first part extending from the first face of the semiconductor substrate while being in contact with the first insulating trench, the first part being extended by a second part lying between the first insulating trench and the buried semiconductor layer, the second trench having a central portion that is electrically conductive and enclosed in an insulating sheath;
   wherein a bottom of the second part is separated from a top of the buried semiconductor layer by a portion of said at least one semiconductor well; and
   an implanted zone that is doped with the second conductivity type, said implanted zone positioned at said portion of said at least one semiconductor well between the second trench and the buried semiconductor layer in contact with both the insulating sheath and the buried semiconductor layer;
at least one first contact electrically connected to the central portion; and
at least one second contact electrically connected to the at least one well.

2. The integrated circuit according to claim 1, wherein the first part of the at least one peripheral part is entirely surrounded by the first insulating trench.

3. The integrated circuit according to claim 1, wherein the first part of the at least one peripheral part lies entirely between the well and the first insulating trench.

4. The integrated circuit according to claim 1, wherein the second trench has at least one additional branch connected to the peripheral part and extending inside the at least one semiconductor well.

5. The integrated circuit according to claim 1, wherein the second trench has a plurality of parallel additional branches connected to the peripheral part and extending inside the at least one semiconductor well.

6. The integrated circuit according to claim 1, further comprising a memory device having a memory plane having nonvolatile memory cells and select transistors with buried gates, wherein the second trench has a depth substantially equal to a depth of the buried gates.

7. The integrated circuit according to claim 1, wherein the first conductivity type is the P type and the second conductivity type is the N type.

8. The integrated circuit according to claim 1, wherein the central portion forms a first electrode of a capacitor and wherein the at least one semiconductor well forms a second electrode of said capacitor.

9. An integrated circuit, comprising:
a semiconductor substrate of a first conductivity type;
a semiconductor well of the first conductivity type within said semiconductor substrate;
an insulating region configured to insulate the at least one semiconductor well from the substrate, said insulating region comprising:
   a first insulating trench extending into the substrate from a first face of the substrate and peripherally surrounding the semiconductor well;
   a semiconductor layer of a second conductivity type, opposite to the first conductivity type, buried in the semiconductor substrate below the semiconductor well; and
   an intermediate insulating zone configured to ensure electrical insulation continuity between the first insulating trench and the buried semiconductor layer, wherein the intermediate insulating zone comprises:
   a peripheral trench which surrounds the semiconductor well;
   at least one branch trench which laterally extends from a first side of the peripheral trench towards a second side of the peripheral trench opposite the first side;
   the peripheral and at least one branch trenches having a first part extending from the first face of the semiconductor substrate while being in contact with the first insulating trench, the first part being extended by a second part lying between the first insulating trench and the buried semiconductor layer, and a central portion that is electrically conductive and enclosed in an insulating sheath;
at least one first contact electrically connected to the central portion; and
at least one second contact electrically connected to the at least one well.

10. The integrated circuit according to claim 9, wherein the first part is entirely surrounded by the first insulating trench.

11. The integrated circuit according to claim 9, wherein the first part lies entirely between the well and the first insulating trench.

12. The integrated circuit according to claim 9, wherein the at least one branch trench comprises a plurality of branch trenches extending parallel to each other from the first side of the peripheral trench.

13. The integrated circuit according to claim 9, wherein the second part is in contact with the buried semiconductor layer.

14. The integrated circuit according to claim 9, wherein a bottom of the second part is separated by a distance from the buried semiconductor layer, and further including an implanted zone doped with the second conductivity type positioned in the semiconductor well between a bottom of the second part and the buried semiconductor layer.

15. The integrated circuit according to claim 14, further comprising a memory device having a memory plane having nonvolatile memory cells and select transistors with buried gates, wherein the second trench has a depth substantially equal to a depth of the buried gates.

16. The integrated circuit according to claim 9, wherein the first conductivity type is the P type and the second conductivity type is the N type.

17. The integrated circuit according to claim 9, wherein the central portion forms a first electrode of a capacitor and wherein the at least one semiconductor well forms a second electrode of said capacitor.

* * * * *